(12) United States Patent
Kitada et al.

(10) Patent No.: US 10,700,258 B2
(45) Date of Patent: Jun. 30, 2020

(54) PIEZOELECTRIC ELEMENT, MANUFACTURING METHOD THEREOF, AND LIQUID EJECTION HEAD

(71) Applicant: Seiko Epson Corporation, Tokyo (JP)

(72) Inventors: Kazuya Kitada, Suwa (JP); Masayuki Omoto, Chino (JP); Tsutomu Asakawa, Shiojiri (JP); Hidemichi Furihata, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/229,556

(22) Filed: Dec. 21, 2018

(65) Prior Publication Data

US 2019/0198747 A1 Jun. 27, 2019

(30) Foreign Application Priority Data

Dec. 25, 2017 (JP) ................. 2017-247944

(51) Int. Cl.
*B41J 2/14* (2006.01)
*H01L 41/09* (2006.01)
(Continued)

(52) U.S. Cl.
CPC .......... *H01L 41/09* (2013.01); *B41J 2/04581* (2013.01); *B41J 2/14233* (2013.01); *B41J 2/161* (2013.01); *B41J 2/1623* (2013.01); *B41J 2/1626* (2013.01); *B41J 2/1631* (2013.01); *B41J 2/1642* (2013.01); *B41J 2/1645* (2013.01); *B41J 2/1646* (2013.01); *H01L 41/047* (2013.01); *H01L 41/081* (2013.01); *H01L 41/1876* (2013.01); *H01L 41/29* (2013.01); *H01L 41/318* (2013.01); *B41J 2002/14241* (2013.01); *B41J 2002/14419* (2013.01); *B41J 2002/14491* (2013.01); *B41J 2202/03* (2013.01)

(58) Field of Classification Search
CPC ................ B41J 2/14201; B41J 2/14209; B41J 2002/14217; B41J 2/1433; B41J 2002/1425; B41J 2/14233; B41J 2/1646; B41J 2/1642; B41J 2/162; B41J 2/161; B41J 2002/14241
See application file for complete search history.

(56) References Cited

U.S. PATENT DOCUMENTS

2011/0291525 A1 12/2011 Maruyama

FOREIGN PATENT DOCUMENTS

| JP | 2001-053347 A | 2/2001 |
| JP | 2008-153689 A | 7/2008 |
| JP | 2011-011516 A | 1/2011 |

OTHER PUBLICATIONS

Daido Steel, "Stainless Steel Chemical Composition (JIS)," published 2005, retrieved from the internet on Dec. 1, 2017 at http://www.daido.co.jp/en/products/stainless/sus_jis.pdf (1 page).
(Continued)

*Primary Examiner* — Kristal Feggins
(74) *Attorney, Agent, or Firm* — Harness, Dickey & Pierce, P.L.C.

(57) ABSTRACT

A piezoelectric element includes a substrate; a first electrode formed above the substrate; a piezoelectric layer which contains a composite oxide having a perovskite crystal structure and which is formed above the first electrode; and a second electrode formed above the piezoelectric layer, and the amount of carbon contained in the substrate is 0.26 to less than 14.00 percent by atom.

7 Claims, 5 Drawing Sheets

(51) Int. Cl.
    *B41J 2/045*     (2006.01)
    *H01L 41/29*     (2013.01)
    *B41J 2/16*     (2006.01)
    *H01L 41/187*     (2006.01)
    *H01L 41/047*     (2006.01)
    *H01L 41/08*     (2006.01)
    *H01L 41/318*     (2013.01)

(56) References Cited

OTHER PUBLICATIONS

Extended European Search Report for Patent Application No. EP18215847.7, dated Jun. 18, 2019 (8 pages).

PIEZOELECTRIC ELEMENT, MANUFACTURING METHOD THEREOF, AND LIQUID EJECTION HEAD

This application claims priority under 35 U.S.C. § 119 to Japanese Patent Application No. 2017-247944 filed on Dec. 25, 2017, the entire disclosure of which is expressly incorporated by reference herein.

BACKGROUND

1. Technical Field

The present invention relates to a piezoelectric element, a manufacturing method thereof, and a liquid ejection head.

2. Related Art

In general, a piezoelectric element includes a piezoelectric layer having electromechanical conversion characteristics and two electrodes sandwiching the piezoelectric layer. The piezoelectric element as described above is used, for example, for a liquid ejection head mounted in an ink jet recording head.

As a piezoelectric material used for the piezoelectric element, various materials, such as lead zirconate titanate (PZT), have been known. In recent years, in view of environmental protection, a lead-free piezoelectric material has been demanded, and for example, a niobium (Nb)-based material capable of forming a perovskite structure has been studied.

In addition, various studies have been done on an electrode to be used for a piezoelectric element, and for example, JP-A-2011-011516 has disclosed that, between an electrode of a piezoelectric element and a vibration plate, when a heat-resistant adhesion layer formed from a metal element, an oxygen element, and one of a carbon element and a nitrogen element is provided, peeling between the vibration plate and the electrode can be suppressed.

Incidentally, in a process of forming a piezoelectric element on a substrate, foreign materials may be generated in some cases. As a result of research carried out by the inventors, it was found that the generation of foreign materials as described above relates to a metal contained in a composite oxide which forms a piezoelectric body of the piezoelectric element and which has a perovskite crystal structure and also relates to carbon contained in the substrate.

SUMMARY

An advantage of some aspects of the invention is to provide a piezoelectric element which suppresses the generation of foreign materials, a manufacturing method thereof, and a liquid ejection head including the piezoelectric element.

The invention was made to solve the problem described above and can be realized by the following aspects or application examples.

One aspect of a piezoelectric element according to the invention comprises: a substrate; a first electrode formed above the substrate; a piezoelectric layer which contains a composite oxide having a perovskite crystal structure and which is formed above the first electrode; and a second electrode formed above the piezoelectric layer, and the amount of carbon contained in the substrate is 0.26 to less than 14.00 percent by atom.

In the piezoelectric element as described above, foreign materials are not likely to be formed. That is, the amount of carbon contained in the substrate is appropriate, and hence, the generation of foreign materials can be suppressed.

In the piezoelectric element according to the invention, the amount of carbon contained in the substrate may be 1.00 to 6.00 percent by atom.

According to the piezoelectric element as described above, the foreign materials are more not likely to be formed.

In the piezoelectric element according to the invention, the piezoelectric layer may contain at least one of potassium, sodium, and lead.

According to the piezoelectric element as described above, even if a piezoelectric body which may more probably generate foreign materials is used, the generation of foreign materials can be sufficiently suppressed.

In the piezoelectric element according to the invention, the substrate may contain zirconium.

According to the piezoelectric element as described above, even if a substrate which may more probably generate foreign materials is used, the generation of foreign materials can be sufficiently suppressed.

In the piezoelectric element according to the invention, the ratio (C/Zr) of the number of carbon atoms to the number of zirconium atoms each contained in the substrate may be 0.1 to 0.5.

According to the piezoelectric element as described above, the foreign materials are more not likely to be formed. That is, the ratio of the amount of carbon to the amount of zirconia contained in the substrate is appropriate, and hence, the generation of foreign materials can be more effectively suppressed.

One aspect of a liquid ejection head according to the invention comprises the piezoelectric element described above.

In the liquid ejection head as described above, foreign materials are not likely to be formed in the piezoelectric element, and high reliability can be obtained.

One aspect of a method for manufacturing a piezoelectric element according to the invention comprises: a step of irradiating a substrate with ultraviolet rays; a step of forming a first electrode above the substrate; a step of forming a piezoelectric layer above the first electrode; and a step of forming a second electrode above the piezoelectric layer.

According to the manufacturing method as described above, a piezoelectric element which is not likely to generate foreign materials can be manufactured.

In addition, in the invention, the case in which a specific B member (hereinafter, referred to as "B") is provided "above" or "below" a specific A member (hereinafter, referred to as "A") indicates both the case in which B is directly provided on A at an upper side or a lower side and the case in which B is provided above or below A with another member interposed therebetween. In addition, the case of "provided on A" is also similar to the case of "provided above A". In addition, the case in which B is present above or below A indicates that A and B may be considered to be present as described above when the viewing direction or the viewing angle is changed, and/or when the viewing field is rotated, and the positional relationship between A and B is irrelevant to the gravity action direction.

In addition, in this specification, although expressions, such as "alkali metal (element) diffuses", "potassium diffuses", "sodium diffuses", and "lead diffuses" are used, those are used to include the cases in which a diffusing material diffuses in the form of a metal, in the form of a compound, and in an unstable state, such as an intermediate (precursor).

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some embodiments of the invention will be described. The following embodiments each will be described as one example of the invention. The invention is not limited to the following embodiments, and various modified embodiments to be implemented without changing the scope of the invention are also included in the invention. In addition, the following constitutions are each not always required to be an essential constitution of the invention.

1. Piezoelectric Element

Figure 1:
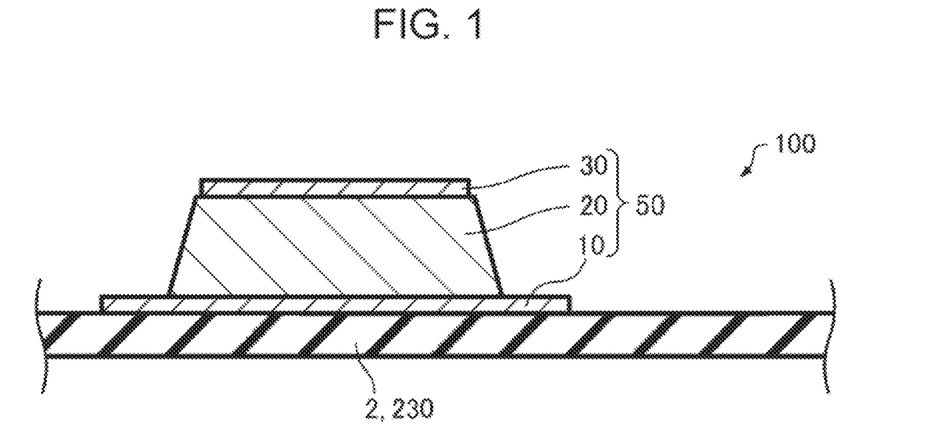
FIG. 1 is a schematic cross-sectional view showing a piezoelectric element according to an embodiment.

A piezoelectric element according to this embodiment will be described with reference to FIG. 1. FIG. 1 is a cross-sectional view schematically showing a piezoelectric element 100 according to this embodiment. The piezoelectric element 100 of this embodiment includes a substrate 2, a first electrode 10, a piezoelectric layer 20, and a second electrode 30.

1.1. Substrate

The substrate 2 is a flat plate formed, for example, from a semiconductor or an insulating material. The substrate 2 may have either a single layer structure or a laminate structure in which layers are laminated to each other. As long as an upper surface of the substrate 2 has a flat shape, the inside structure thereof is not particularly limited, and for example, the structure in which at least one space or the like is formed may also be used.

In addition, the substrate 2 may be a vibration plate 230 which has flexibility and which can be deformed (displaced) by the operation of the piezoelectric layer 20 or may have a more complicated structural body including the vibration plate 230 described above. When the substrate 2 is the vibration plate 230, the vibration plate 230 may be, for example, a silicon oxide layer, a zirconium oxide layer, or a laminate thereof (such as a laminate in which the zirconium oxide layer is provided on the silicon oxide layer). In addition, although not shown in the FIG. 1, an adhesion layer which improves the adhesion between the first electrode 10 and the substrate 2 may be provided therebetween. The adhesion layer is, for example, a titanium layer or a titanium oxide layer.

In addition, in this specification, as is the example shown in FIG. 1, the piezoelectric element 100 includes the substrate 2 (vibration plate 230), and this structure may also be called an actuator in some cases. That is, the piezoelectric element 100 may be regarded as an actuator including the vibration plate 230 and a piezoelectric structural body 50. In the case as described above, the piezoelectric structural body 50 is configured to include the first electrode 10, the piezoelectric layer 20, and the second electrode layer 30. The vibration plate 230 can be bent or vibrated when the piezoelectric layer 20 is deformed. In addition, since the vibration plate 230 forms a part of a wall defining a pressure generation chamber of a liquid ejection head which will be described later, the volume of the pressure generation chamber can be changed in accordance with a signal to be input.

In the substrate 2 (vibration plate 230), carbon (C) is contained. The amount of carbon contained in the substrate 2 is 0.26 to less than 14.00 percent by atom. When the amount of carbon contained in the substrate 2 is in the range described above, foreign materials are not likely to be generated in the piezoelectric element 100. The amount of carbon contained in the substrate 2 is more preferably 0.50 to 12.00 percent by atom, further preferably 1.00 to 7.00 percent by atom, and even further preferably 3.00 to 7.00 percent by atom. When the amount of carbon contained in the substrate 2 is less than 0.26 percent by atom, other substances (such as water, chloride, and other reactive gases) are likely to be adsorbed to the substrate 2 (a block effect by carbon is weakened), and the surface of the substrate 2 is liable to be contaminated. In addition, when the amount of carbon contained in the substrate 2 is 14.00 percent by atom or more, for example, carbon may react with elements contained in the piezoelectric layer 20, and a large amount of foreign materials is generated. As described above, through the investigation carried out by the inventors, it has been gradually understood that the amount of carbon contained in the substrate 2 relates to the amount of foreign materials to be generated (this relationship is to be verified by experimental examples which will be described below). In addition, when a commercially available product is used as the substrate 2, in general, immediately after purchase thereof, the amount of carbon contained in the substrate 2 is approximately 0.26 percent by atom. When the substrate 2 under this condition is used, the generation of foreign materials is more not likely to occur.

In addition, when a zirconium oxide layer is provided at a surface side of the substrate 2, the ratio (C/Zr) of the number of carbon atoms to the number of zirconium atoms each contained in the substrate 2 can be obtained. The ratio (C/Zr) is preferably 0.1 to 0.5, more preferably 0.1 to 0.45, and further preferably 0.1 to 0.4. When the ratio (C/Zr) is in the range described above, foreign materials are not likely to be formed in the piezoelectric element 100. That is, the generation of foreign materials can be more effectively suppressed.

The amount of carbon and the amount of zirconium contained in the substrate 2 can be measured, for example, by an X-ray photoelectron spectroscopy (XPS), a secondary ion mass spectroscopy (SIMS), or a transmission electron microscope-energy dispersive spectroscopy (TEM-EDX).

1.2. First Electrode

The first electrode 10 is formed above the substrate 2. The first electrode 10 is one electrode which applies the voltage to the piezoelectric layer 20. The first electrode 10 may also be called a lower electrode provided under the piezoelectric layer 20. In the example shown in FIG. 1, the first electrode 10 is provided on the substrate 2 (vibration plate 230).

The first electrode 10 has, for example, a layer shape. The film thickness (thickness) of the first electrode 10 is, for example, from 3 to 200 nm. Although a material of the first electrode 10 is not particularly limited as long as having electrical conductivity, for example, a metal layer, such as an iridium layer or a platinum layer, an electrically conductive oxide layer (such as an iridium oxide layer), or a strontium ruthenate layer may be used. The first electrode 10 may have the structure in which layers formed from the material mentioned above by way of example are laminated to each other.

1.3. Piezoelectric Layer

The piezoelectric layer 20 is provided above the first electrode 10. In the example shown in FIG. 1, the piezoelectric layer 20 is provided on the first electrode 10. The film thickness of the piezoelectric layer 20 is, for example, from 100 nm to 3 μm. When the voltage is applied between the first electrode 10 and the second electrode 30, the piezoelectric layer 20 can be deformed. The piezoelectric layer 20 has a perovskite crystal structure, and by application of the voltage, the electromechanical conversion effect is obtained.

The piezoelectric layer 20 is not particularly limited as long as a material having a piezoelectric property is used, and for example, a composite oxide having a perovskite crystal structure may be used. As an element contained in the piezoelectric layer 20, for example, there may be mentioned Pb, Ba, Nb, La, Li, Sr, Bi, Na, K, Fe, Ti, Ta, Mg, Mo, Ni, Zr, Zn, W, and Yb. Among materials containing the elements mentioned above, since a more preferable piezoelectric property can be easily obtained, for example, a composite oxide (lead zirconate titanate (PZT)) containing Ti, Zr, and Pb or a composite oxide (KNN) containing potassium (K), sodium (Na), and niobium (Nb) is more preferable. In addition, when K, Na, and Nb form a perovskite crystal structure, K and Na are likely to be disposed at the A site, and Nb is likely to be disposed at the B site.

In addition, when a composite oxide having a perovskite crystal structure is used, in general, a raw material for the A site is excessively charged (in an excess amount) as compared to that of the stoichiometric composition and is then fired.

In the piezoelectric layer 20 of this embodiment, as is the case of KNN, potassium and sodium, each of which is an alkali metal, may be contained. Since having a relatively high diffusion coefficient (low activation energy) as compared to that of each of other elements contained in the piezoelectric layer 20, potassium and sodium are likely to travel in the piezoelectric layer 20. In addition, when the piezoelectric layer 20 is formed by crystallization, potassium and sodium are not likely to be fitted to the A site of a growing crystal and are liable not to stay at the A site. Hence, also in the case of KNN, as is the case of the other piezoelectric material, raw materials of potassium and sodium for the A site are each charged in an excess amount and are then fired. Since the raw materials of potassium and sodium are each charged in an excess amount, the probability that potassium and sodium are brought into contact with the A site at which those elements are to be disposed is increased in the crystallization process, and the crystallization rate and the crystallinity can be improved. On the other hand, for example, when carbon (C) and/or organic substances are present around the periphery of the piezoelectric layer 20, excess potassium and sodium which form no perovskite structure are likely to interact therewith. However, since the amount of carbon contained in the substrate 2 is appropriate in the piezoelectric element 100 of this embodiment, even if KNN is used, the generation of foreign materials can be sufficiently suppressed. As is the case described above, also in the case of PZT, since an excess amount of lead is generally charged, when the amount of carbon contained in the substrate 2 is appropriate, the generation of foreign materials can be sufficiently suppressed.

1.4. Second Electrode

The second electrode 30 is provided above the piezoelectric layer 20. In the example shown in FIG. 1, the second electrode 30 is provided on the piezoelectric layer 20. The second electrode 30 is another electrode which applies the voltage to the piezoelectric layer 20. The second electrode 30 is an upper electrode provided on the piezoelectric layer 20.

The second electrode 30 has, for example, a layer shape. The film thickness of the second electrode 30 is, for example, from 50 nm to 300 nm. The second electrode 30 is, for example, a metal layer, such as an iridium layer or a platinum layer, an electrically conductive oxide layer thereof (such as an iridium oxide layer), or a strontium ruthenate layer. The second electrode 30 may have the structure in which layers each described above by way of example are laminated to each other.

1.5. Application of Piezoelectric Element (Actuator)

As a piezoelectric actuator which applies the pressure to a liquid in the pressure generation chamber, the piezoelectric element 100 (actuator) may be used, for example, for a liquid ejection head or a printer using the liquid ejection head. In addition, the piezoelectric element 100 may be used, for example, for a piezoelectric sensor (an ultrasonic sensor or a gyro sensor) which detects the deformation of the piezoelectric layer as an electric signal.

1.6. Operational Advantage and the Like

In the piezoelectric element 100 of this embodiment, foreign materials are not likely to be generated. That is, the amount of carbon contained in the substrate 2 is appropriate, and hence, the generation of foreign materials can be suppressed.

2. Method for Manufacturing Piezoelectric Element

Next, a method for manufacturing the piezoelectric element 100 according to this embodiment will be described.

First, the substrate 2 is prepared. In particular, a silicon substrate is thermally oxidized to form a silicon oxide layer. Next, a zirconium layer is formed on the silicon oxide layer by a sputtering method or the like and is then thermally oxidized, so that a zirconium oxide layer is formed. By the steps described above, the substrate 2 can be prepared.

In addition, if needed, a step of irradiating the substrate 2 with ultraviolet rays may be performed. As the ultraviolet rays, an electromagnetic wave (ultraviolet radiation) having a wavelength of approximately 10 to 400 nm is used. The ultraviolet rays may be a mixture of ultraviolet rays having a plurality of wavelengths. The ultraviolet rays used in this step preferably include ultraviolet rays having a short wavelength, and for example, the wavelength is 300 nm or less, preferably 250 nm or less, and more preferably 200 nm or less.

When the step of irradiating ultraviolet rays is used, the amount of carbon (C) contained in the substrate 2 can be decreased. The mechanism of decreasing the amount of carbon by ultraviolet irradiation is that the bonds between carbon atoms are broken and/or decomposed by ultraviolet rays having a short wavelength, and as shown in the experimental examples which will be described later, it has been known that the amount of carbon contained in the substrate 2 is decreased. Although the irradiation of ultraviolet rays is preferably performed in a vacuum chamber, even if the irradiation is performed in the air, an oxygen atmosphere, or a nitrogen atmosphere, the effect of decreasing the carbon can be obtained. For example, when the amount of carbon contained in the substrate 2 is excessively large, by the use of this step, the amount of carbon can be efficiently decreased to a predetermined amount.

When the ultraviolet rays are irradiated, the intensity, the time, the atmosphere, the apparatus, and the like may be appropriately determined, and in addition, if needed, the temperature of an object to be irradiated and the atmosphere, such as a nitrogen atmosphere or an oxygen atmosphere, during irradiation may be appropriately set.

In addition, if needed, an oxygen plasma ashing step may also be performed on the substrate 2. When the oxygen plasma ashing step is performed, the amount of carbon (C) contained in the substrate 2 can be decreased. The mechanism of decreasing the carbon by oxygen plasma ashing is believed that carbon reacts with oxygen having a high reactivity and is then decomposed into $CO_2$ and the like. Accordingly, as shown in the experimental examples which will be described below, it has been known that the amount of carbon contained in the substrate 2 is decreased. A particular oxygen plasma asking treatment is not specifically limited.

Furthermore, in addition to the treatments described above, it has been also known that by a heat treatment at a high temperature, for example, of 650° C. or more, the amount of carbon can be further decreased.

In addition, if needed, for example, a step of leaving the substrate 2 in the air and/or a step of performing ion-implantation of carbon in the substrate 2 may be performed. By the steps described above, the amount of carbon contained in the substrate 2 can be increased. As has thus been described, when the amount of carbon contained in the substrate 2 is too small, adsorption amounts of water, chloride, and the like may be increased in some cases; hence, when the amount of carbon is increased by the step described above, the adsorption of water, chloride, and the like can be suppressed.

Next, on the substrate 2, the first electrode 10 is formed. The first electrode 10 is formed, for example, by a sputtering method or a vacuum deposition method. Before the first electrode 10 is formed, a film may be formed from titanium as an adhesion layer.

Next, the piezoelectric layer 20 is formed on the first electrode 10. The piezoelectric layer 20 is formed, for example, by a liquid phase method (chemical solution method), such as a sol-gel method or a metal organic deposition (MOD) method.

In particular, in accordance with the composition of a piezoelectric body to be manufactured, and if needed, in consideration of excess amounts, metal complexes of Pb, Ba, Nb, La, Li, Sr, Bi, Na, K, Fe, Ti, Ta, Mg, Mo, Ni, Zr, Zn, W, and Yb may be selectively dissolved or dispersed in an organic solvent so as to prepare a precursor solution.

The precursor solution thus prepared is applied on the first electrode 10 using a spin coating method or the like to form a precursor layer (coating step). Next, the precursor layer is heated at 130° C. to 250° C. and is dried for a predetermined time (drying step). Furthermore, the precursor layer thus dried was heated, for example, at 300° C. to 450° C. and is then held for a predetermined time for degreasing (degreasing step). Next, the degreased precursor layer is heated, for example, at 600° C. to 800° C. and is then held at this temperature for a predetermined time, so that the precursor layer is crystallized (firing step).

By the steps described above, the piezoelectric layer 20 is formed on the first electrode 10. In addition, by repeatedly performing a series of steps from the coating step to the firing step a plurality of times, the piezoelectric layer 20 may also be formed from a plurality of layers. As a heating apparatus used in the drying step, the degreasing step, and the firing step to form the piezoelectric layer 20, for example, a rapid thermal annealing (RTA) apparatus which performs heating using an infrared lamp may be mentioned.

In addition, when a KNN-based piezoelectric body is used for the piezoelectric layer 20, as a metal complex containing K, for example, potassium 2-ethylhexanoate or potassium acetate may be mentioned. As a metal complex containing Na, for example, sodium 2-ethylhexanoate or sodium acetate may be mentioned. As a metal complex containing Nb, for example, niobium 2-ethylhexanoate or pentaethoxyniobium may be mentioned. In addition, at least two types of metal complexes may be used in combination. For example, as the metal complex containing potassium, potassium 2-ethylhexanoate and potassium acetate may be used in combination.

As the solvent, for example, propanol, butanol, pentanol, hexanol, octanol, ethylene glycol, propylene glycol, octane, decane, cyclohexane, xylene, toluene, tetrahydrofuran, acetic acid, octyl acid, 2-n-butoxyethanol, or a mixed solvent thereof may be mentioned.

Next, the piezoelectric layer 20 is patterned. As a result, as shown in FIG. 1, the piezoelectric layer 20 and the first electrode 10 each can be formed to have a predetermined shape. The patterning is performed, for example, by photolithography and etching. In addition, the patterning may be performed after a film to be used as the second electrode 30 is formed.

Next, the second electrode 30 is formed on the piezoelectric layer 20. The second electrode 30 is formed, for example, by film formation using a sputtering method or a vacuum deposition method and by patterning using photolithography and etching.

By the steps described above, the piezoelectric element 100 can be manufactured. In the case in which the substrate 2 is the vibration plate 230, or in the case in which the substrate 2 is further processed to form the vibration plate 230, for example, at least one appropriate step may be added to the steps described above, so that the actuator can be manufactured.

In addition, although the example in which the piezoelectric layer 20 is formed by a liquid phase method has been described, the method for forming the piezoelectric layer 20 is not particularly limited, and for example, a chemical vapor deposition (CVD) method or a sputtering method may also be used.

According to the method for manufacturing a piezoelectric element as described above, a piezoelectric element which suppresses the generation of foreign materials can be manufactured.

3. Liquid Ejection Head

Figure 2:
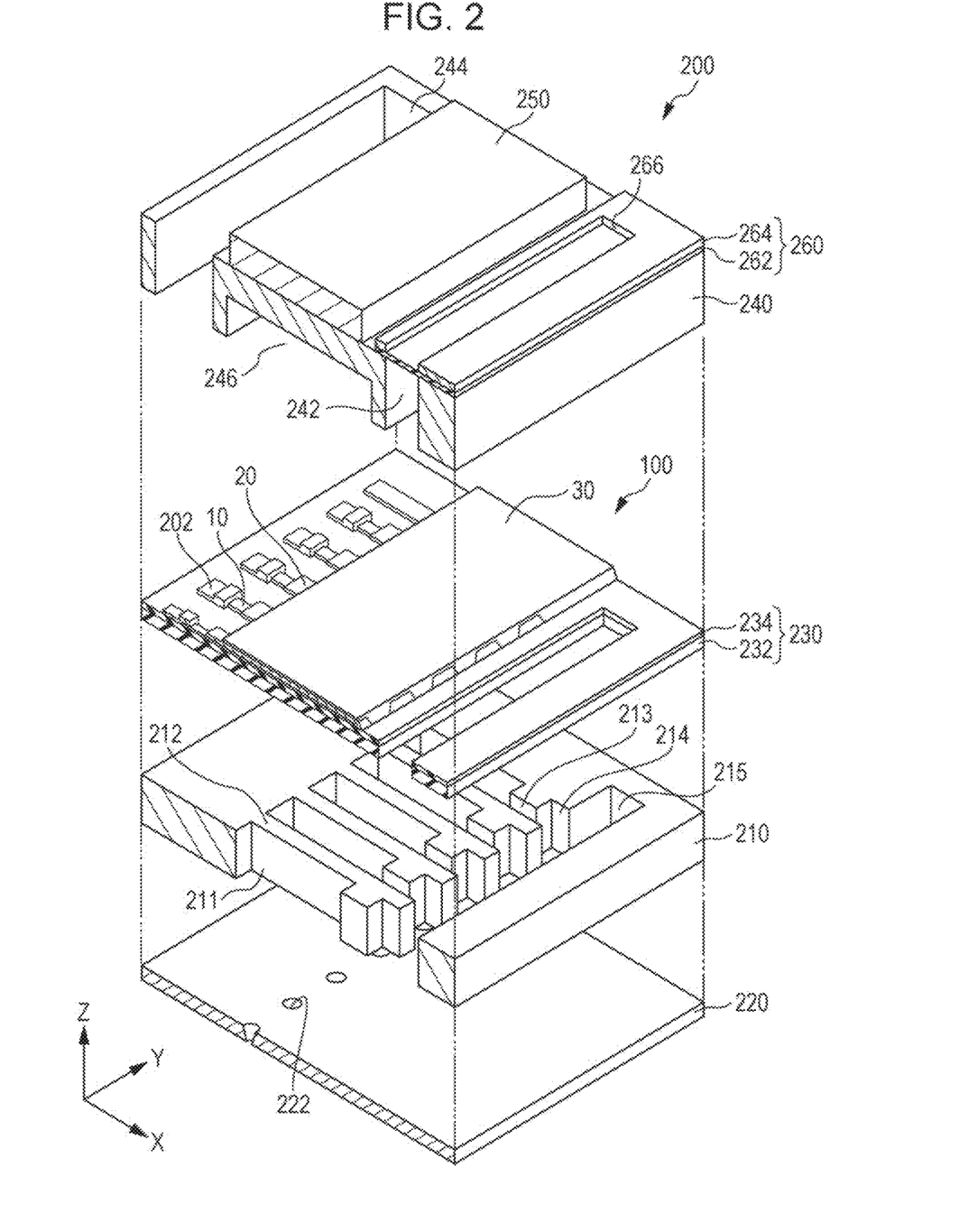
FIG. 2 is an exploded perspective view schematically showing a liquid ejection head according to an embodiment.
Figure 3:
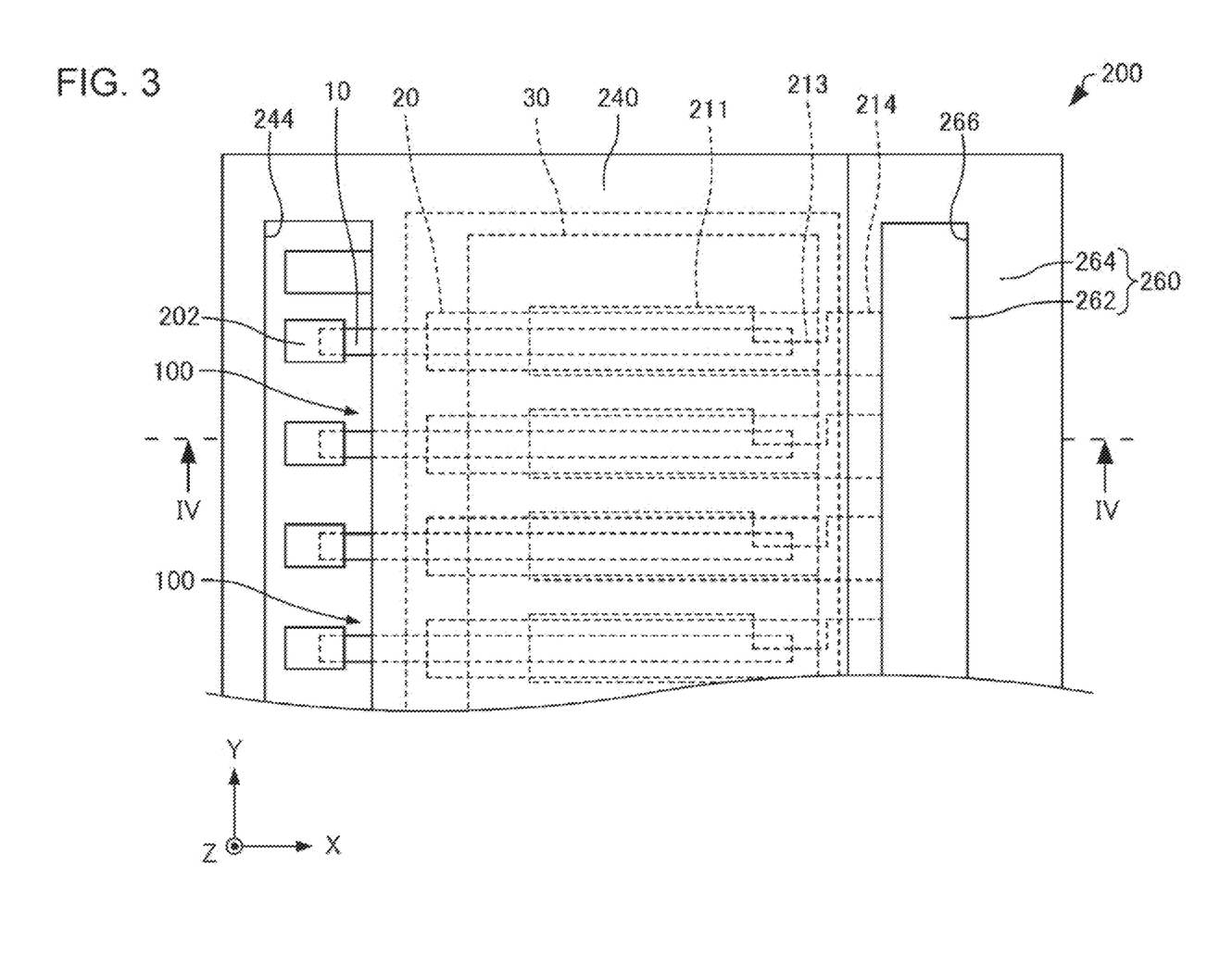
FIG. 3 is a plan view schematically showing the liquid ejection head according to the embodiment.
Figure 4:
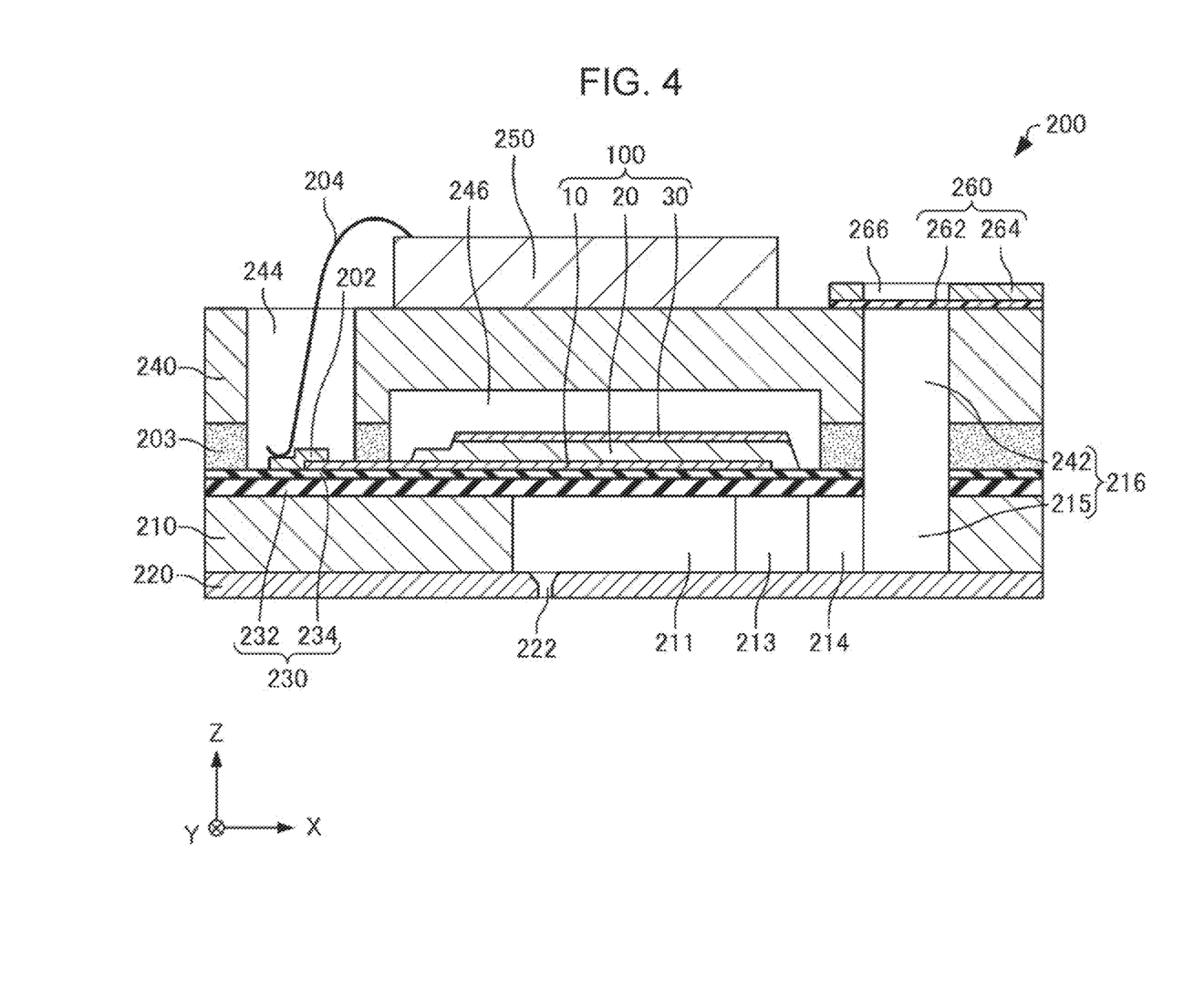
FIG. 4 is a cross-sectional view schematically showing the liquid ejection head according to the embodiment.

Next, a liquid ejection head according to this embodiment will be described with reference to the drawings. FIG. 2 is an exploded perspective view schematically showing a liquid ejection head 200 according to this embodiment. FIG. 3 is a plan view schematically showing the liquid ejection head 200 according to this embodiment. FIG. 4 is a schematic cross-sectional view of the liquid ejection head 200 taken along the line IV-IV in FIG. 3. In addition, in FIGS.

2 to 4, as the three axes orthogonal to each other, an X axis, a Y axis, and a Z axis are shown.

The liquid ejection head according to the invention includes the piezoelectric element 100 described above. Hereinafter, as one example, the liquid ejection head 200 including the piezoelectric elements 100 will be described.

As shown in FIGS. 2 to 4, the liquid ejection head 200 includes, for example, the piezoelectric elements 100, a flow path forming substrate 210, a nozzle plate 220, the vibration plate 230, a protective substrate 240, a circuit substrate 250, and a compliance substrate 260. In addition, for convenience, in FIG. 3, the circuit substrate 250 and connection wires 204 are omitted.

The flow path forming substrate 210 is, for example, a silicon substrate. In the flow path forming substrate 210, pressure generation chambers 211 are provided. The pressure generation chambers 211 are separated from each other by a plurality of partitions 212.

In the flow path forming substrate 210, at an end portion of the pressure generation chamber 211 at a +X axis direction side, an ink supply path 213 and a communication path 214 are provided. The ink supply path 213 is formed so that its opening area is decreased by squeezing the end portion of the pressure generation chamber 211 at the +X axis direction side in a Y axis direction. The size of the communication path 214 in the Y axis direction is, for example, the same as that of the pressure generation chamber 211 in the Y axis direction. At the +X axis direction side of the communication path 214, a communication portion 215 is provided. The communication portion 215 forms a part of a manifold 216. The manifold 216 is used as a common ink chamber for the pressure generation chambers 211. As described above, in the flow path forming substrate 210, liquid flow paths each formed from the pressure generation chamber 211, the ink supply path 213, the communication path 214, and the communication portion 215 are formed.

The nozzle plate 220 is provided on one surface (surface located at a −Z axis direction side) of the flow path forming substrate 210. A material of the nozzle plate 220 is, for example, Steel Use Stainless (SUS). The nozzle plate 220 is bonded to the flow path forming substrate 210 with an adhesive, a heat welding film, or the like. In the nozzle plate 220, nozzle openings 222 are provided along the Y axis. The nozzle openings 222 are configured to communicate with the respective pressure generation chambers 211.

The vibration plate 230 is provided on the other surface (surface at a +Z axis direction side) of the flow path forming substrate 210. The vibration plate 230 is formed, for example, of a first insulating layer 232 formed on the flow path forming substrate 210 and a second insulating layer 234 provided on the first insulating layer 232. The first insulating layer 232 is, for example, a silicon oxide layer. The second insulating layer 234 is, for example, a zirconium oxide layer.

The piezoelectric element 100 is provided, for example, on the vibration plate 230. A plurality of the piezoelectric elements 100 is provided. The number of the piezoelectric elements 100 is not particularly limited.

In the liquid ejection head 200, by the deformation of the piezoelectric layer 20 having electromechanical conversion characteristics, the vibration plate 230 and the first electrode 10 are displaced. That is, in the liquid ejection head 200, the vibration plate 230 and the first electrode 10 substantially function as the vibration plate. In addition, the vibration plate 230 may be omitted so that the first electrode 10 only functions as the vibration plate. When the first electrode 10 is directly provided on the flow path forming substrate 210, the first electrode 10 is preferably protected by an insulating protective film or the like so that an ink is not brought into contact with the first electrode 10.

The first electrodes 10 are each formed as an independent discrete electrode for each pressure generation chamber 211. The size of the first electrode 10 in the Y axis direction is smaller than the size of the pressure generation chamber 211 in the Y axis direction. The size of the first electrode 10 in an X axis direction is larger than the size of the pressure generation chamber 211 in the X axis direction. In the X axis direction, the two end portions of the first electrode 10 are located outside from the two end portions of the pressure generation chamber 211. To the end portion of the first electrode 10 at a −X axis direction side, a lead electrode 202 is connected.

The size of the piezoelectric layer 20 in the Y axis direction is, for example, larger than the size of the first electrode 10 in the Y axis direction. The size of the piezoelectric layer 20 in the X axis direction is, for example, larger than the size of the pressure generation chamber 211 in the X axis direction. The end portion of the piezoelectric layer 20 at the +X axis direction side is located, for example, outside (at the +X axis direction side) from the end portion of the first electrode 10 at the +X axis direction side. That is, the end portion of the first electrode 10 at the +X axis direction side is covered with the piezoelectric layer 20. On the other hand, the end portion of the piezoelectric layer 20 at the −X axis direction side is located, for example, inside (at the +X axis direction side) from the end portion of the first electrode 10 at the −X axis direction side. That is, the end portion of the first electrode 10 at the −X axis direction side is not covered with the piezoelectric layer 20.

The second electrode 30 is continuously provided on the piezoelectric layers 20 and the vibration plate 230. The second electrode 30 is formed as a common electrode commonly used for the piezoelectric elements 100. In addition, although not shown in the drawings, instead of the second electrode 30, the first electrode 10 may be used as a common electrode.

The protective substrate 240 is bonded to the flow path forming substrate 210 with an adhesive 203 interposed therebetween. In the protective substrate 240, a through-hole 242 is provided. In the example shown in the drawings, the through-hole 242 penetrates the protective substrate 240 in a Z axis direction and communicates with the communication portion 215. The through-hole 242 and the communication portion 215 collectively form the manifold 216 to be used as a common ink chamber for the pressure generation chambers 211. Furthermore, in the protective substrate 240, a through-hole 244 penetrating the protective substrate 240 in the Z axis direction is provided. In the through-hole 244, the end portions of the lead electrodes 202 are located.

In the protective substrate 240, an opening portion 246 is provided. The opening portion 246 is a space so as not to disturb the operation of the piezoelectric elements 100. The opening portion 246 may be either sealed or not sealed.

The circuit substrate 250 is provided on the protective substrate 240. In the circuit substrate 250, a semiconductor integrated circuit (IC) which drives the piezoelectric elements 100 is included. The circuit substrate 250 is electrically connected to the lead electrodes 202 with the connection wires 204 interposed therebetween.

The compliance substrate 260 is provided on the protective substrate 240. The compliance substrate 260 includes a sealing layer 262 provided on the protective substrate 240 and a fixing plate 264 provided on the sealing layer 262. The sealing layer 262 is a layer sealing the manifold 216. The sealing layer 262 has, for example, flexibility. In the fixing plate 264, a through-hole 266 is provided. The through-hole 266 penetrates the fixing plate 264 in the Z axis direction. The through-hole 266 is provided at a position overlapped with the manifold 216 when viewed in plan (viewed in the Z axis direction).

Since the liquid ejection head 200 includes the above piezoelectric elements 100, foreign materials are not likely to be generate, and for example, since the adhesion between the vibration plate and the piezoelectric element is not likely to be degraded, the reliability is preferable. In addition, since foreign materials are not likely to be generated in the piezoelectric element 100, the production yield is also preferable.

4. Examples

Hereinafter, although the invention will be described in more detail with reference to the following experimental examples, the invention is not limited thereto.

4.1. Preparation of Substrate

A 6" silicon substrate (wafer) was prepared. The silicon substrate was thermally oxidized, so that a silicon dioxide film was formed on the substrate. Next, by a sputtering method, a zirconium film was formed, and thermal oxidation was then performed, so that a zirconium oxide film was formed. After a plurality of substrates each as described above was prepared, as shown in Table 1, no ultraviolet irradiation was performed in Experimental Examples 1 to 6 and 10, and ultraviolet irradiation was performed in Experimental Examples 7 to 9. In Experimental Example 8, by the use of a hot plate, a heat treatment was performed at 650° C. In addition, in Experimental Example 10, oxygen plasma ashing was performed.

In addition, the ultraviolet irradiation was performed using SFD01 manufactured by Ushio Inc. under the conditions that in Experimental Example 7, UV rays having a wavelength of 172 nm was irradiated for 5 minutes in an $O_2$ gas flow atmosphere; and in Experimental Example 8, after UV irradiation similar to that described above was performed, a heat treatment was performed at 650° C. In Experimental Example 9, except for that the gas was changed to $N_2$, UV irradiation was performed under the conditions similar to those of Experimental Example 7. For the oxygen plasma ashing in Experimental Example 10, while an $O_2$ gas flow rate, a $N_2$ gas flow rate, and the pressure were set to 1,160 sccm, sccm, and 800 mTorr, respectively, a treatment was performed at an output of 1,200 W and a stage temperature of 90° C. for 5 minutes using TCA-3822 manufactured by Tokyo Ohka Kogyo Co., Ltd.

4.2. Formation of First Electrode

On the substrate prepared as described above, a titanium film was formed by a sputtering method and was then thermally oxidized, so that a titanium oxide film was formed. Subsequently, by a sputtering method, platinum was deposited on this film at a substrate temperature of 450° C., so that a first electrode was formed.

4.3. Formation of Piezoelectric Layer and Second Electrode

By the use of a solution containing potassium 2-ethylhexanoate, a solution containing sodium 2-ethylhexanoate, a solution containing niobium 2-ethylhexanoate, and a solution containing manganese 2-ethylhexanoate, a solution was prepared to have a composition represented by $(K_{0.2}Na_{0.8})NbO_3$ and was then applied on each substrate by a spin coating method. Subsequently, after drying and degreasing were performed at 180° C. and 380° C., respectively, by the use of rapid thermal annealing (RTA), a heat treatment was performed at 650° C. for 3 minutes. In addition, the steps from the application to the heat treatment by RTA were repeatedly performed 6 times, so that a piezoelectric layer was formed. Next, a second electrode having a thickness of 50 nm was formed by a sputtering method using platinum.

4.4. Measurement of Amount of Carbon

By the use of an X-ray photoelectron spectroscopy apparatus, ESCALAB250 manufactured by Thermo Fisher Scientific, the amount of carbon of each substrate prepared in "4.1. Preparation of Substrate" was measured. As an X-ray source, Al-Kα rays having a spot diameter of 120 μm was used, and the measurement was performed while electron gun irradiation was performed for charge correction. A survey spectrum was measured at a step interval of 1 eV, a pass energy of 200 eV, and a dwell time of 100 μs, so that the peak positions of C and Z were obtained. Furthermore, in order to evaluate the amount of carbon in more detail, after a peak derived from C1s observed at a binding energy of 278 to 289 eV was measured at a step interval 0.1 eV and a pass energy of 20 eV, the background was subtracted therefrom to obtain the area, and the amount of carbon was obtained by multiplying the area thus obtained by the inherent sensitivity coefficients of the measurement apparatus and the orbit of each element. As was the case described above, the amount of Zr was also obtained using a Zr3d peak observed at a binding energy of 174 to 192 eV. From the measurement results, the amount of carbon and the amount of Zr of the sample were obtained. The ratio (C/Zr) of the number of carbon atoms to the number of zirconium atom, which was calculated from the amount of carbon and the amount of Zr obtained as described above, is also shown in Table 1.

TABLE 1

| | EXPERIMENTAL EXAMPLE No. | | | | | | | | | |
|---|---|---|---|---|---|---|---|---|---|---|
| | 1 | 2 | 3 | 4 | 5 | 6 | 7 | 8 | 9 | 10 |
| ULTRAVIOLET IRRADIATION | NO | NO | NO | NO | NO | NO | YES $O_2$ | YES $O_2$ | YES $N_2$ | NO |
| HEAT TREATMENT | NO | NO | NO | NO | NO | NO | NO | YES | NO | NO |
| OXYGEN PLASMA ASHING | NO | NO | NO | NO | NO | NO | NO | NO | NO | YES |
| AMOUNT OF CARBON (PERCENT BY ATOM) | 5.80 | 6.50 | 6.70 | 6.90 | 11.40 | 14.00 | 4.01 | 3.60 | 3.32 | 4.21 |
| C/Zr RATIO | 0.19 | 0.21 | 0.21 | 0.23 | 0.41 | 0.51 | 0.13 | 0.11 | 0.10 | 0.13 |
| EVALUATION OF FOREIGN MATERIALS | A | A | A | A | B | C | A | A | A | A |

4.5. Evaluation of Foreign Materials

Figure 5:
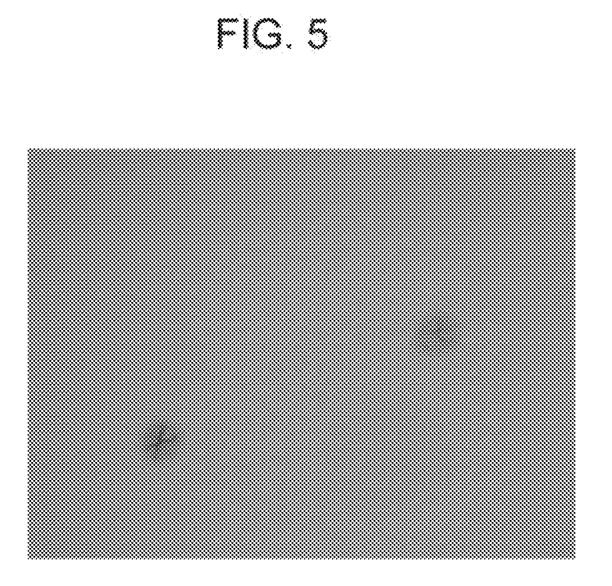
FIG. 5 shows one example of an observation result of a sample according to an experimental example obtained by an optical microscope.

In "4.3. Formation of Piezoelectric Layer and Second Electrode", before the second electrode was formed, the substrates were each observed from a surface side by an optical microscope (manufactured by Nikon Instech Co., Ltd., OPTIPHOT200), so that foreign materials were evaluated. One example of the evaluation results is shown in FIG. 5. As shown in FIG. 5, when foreign materials were present in the sample, the foreign materials could be observed by an optical microscope. In addition, the foreign materials were present so as to protrude from a substrate side. In addition, from the results of observation using a scanning electron microscope (SEM), it was found that the foreign materials were present from the inside to the surface of the sample. For each of the samples of the experimental examples, 10 viewing fields each having a size of 5 mm by 5 mm were randomly observed to confirm whether the foreign materials were present or not and to measure the number of viewing fields including foreign materials, and the evaluation was performed in accordance with the following criteria. The results thereof are shown in Table 1.

A: Foreign materials were observed in 2 viewing fields or less among 10 viewing fields.

B: Foreign materials were observed in 3 to 7 viewing fields among 10 viewing fields.

C: Foreign materials were observed in 8 or more viewing fields among 10 viewing fields.

4.6. Analysis of Foreign Materials

The samples in which foreign materials were observed were measured using a scanning transmission electron microscope-energy dispersive X-ray (STEM-EDX) analysis apparatus (manufactured by Hitachi Hi-Technologies Corporation, HD-2000). As a result, it was found that the foreign materials contained carbon and alkali metals (potassium and sodium).

4.7. Analysis of Carbon Position

A SIMS analysis was performed on the sample including the second electrode which was obtained in "4.3. Formation of Piezoelectric Layer and Second Electrode". SIMS was performed in order to confirm the distribution of elements in the piezoelectric element. For the analysis, by the use of IMS-7f sector type SIMS apparatus manufactured by CAMECA, a $Cs^+$ beam current of 10 nA was raster scanned at 15 keV to a 100 μm square area as primary ions, and negative secondary ions were detected from a central portion having a diameter of 33 The mass resolution ability M/ΔM was set to 5,000. In order to prevent the charge-up, an electron gun was used.

From the results of the SIMS analysis, it was found that even when the steps of forming the first electrode, the piezoelectric layer, and the second electrode were added, a large amount of carbon was present on $ZrO_2$. In addition, in the sample in which the foreign materials were observed, the amount of carbon was large at a position at which the foreign materials were observed. The signal intensity of the carbon on $ZrO_2$ in Experimental Example 1 was $1.76 \times 10^4$ (CPS), and the signal intensity of the carbon on $ZrO_2$ in Experimental Example 6 was $9.45 \times 10^4$ (CPS). Although the results described above can be relatively compared to each other, the results also show that even when the step of forming the second electrode is performed, the localization of carbon on $ZrO_2$ is not changed.

4.8. Evaluation Results

From the results described above, it was found that a predetermined amount or more of carbon was present in the substrate. In addition, it is believed that by this carbon, since Ti and/or an alkali metal is reduced, and reduced products thus obtained cause a reaction, new products are generated and that by volume expansion thereof due to generation of gases, such as $CO_x$, partially protruding foreign materials are produced. This phenomenon not only occurs by an alkali metal material but also by a material containing Pb. In addition, when the amount of carbon in the substrate is 11.4 percent by atom (Experimental Example 5), the generation of foreign materials was confirmed. However, in view of the production yield, the generation of foreign materials in Experimental Examples 5 and 6 are within the acceptable range.

The invention is not limited to the embodiments described above and may be variously changed and/or modified. For example, the invention includes substantially the same constitution (for example, the function, the method, and/or the result has the same constitution, or the purpose and/or the effect has the same constitution) as that described in at least one of the embodiments. In addition, the invention includes a constitution in which a nonessential portion of the constitution described in at least one of the embodiments is replaced with something else. In addition, the invention includes a constitution capable of obtaining the same functional effect or achieving the same purpose as that of the constitution described in at least one of the embodiments. In addition, the invention includes a constitution in which a known technique is added to the constitution described in at least one of the embodiments.

What is claimed is:

1. A piezoelectric element comprising:
   a substrate;
   a first electrode formed above the substrate;
   a piezoelectric layer which contains a composite oxide having a perovskite crystal structure and which is formed above the first electrode; and
   a second electrode formed above the piezoelectric layer,
   wherein the substrate includes carbon and zirconium, an amount of carbon contained in the substrate is 0.26 to less than 14.00 percent by atom, and a ratio (C/Zr) of a number of carbon atoms to a number of zirconium atoms each contained in the substrate is 0.1 to 0.5.

2. The piezoelectric element according to claim 1, wherein an amount of carbon contained in the substrate is 1.00 to 7.00 percent by atom.

3. A liquid ejection head comprising:
   a flow path forming substrate defining a pressure chamber;
   the piezoelectric element according to claim 2 for ejecting a fluid from the pressure chamber upon actuation of the piezoelectric element.

4. The piezoelectric element according to claim 1, wherein the piezoelectric layer contains at least one of potassium, sodium, and lead.

5. A liquid ejection head comprising:
   a flow path forming substrate defining a pressure chamber;
   the piezoelectric element according to claim 4 for ejecting a fluid from the pressure chamber upon actuation of the piezoelectric element.

6. A liquid ejection head comprising:
   a flow path forming substrate defining a pressure chamber;
   the piezoelectric element according to claim 1 for ejecting a fluid from the pressure chamber upon actuation of the piezoelectric element.

7. A method for manufacturing a piezoelectric element comprising:
   irradiating a substrate with ultraviolet rays;
   forming a first electrode above the substrate;

forming a piezoelectric layer above the first electrode; and
forming a second electrode above the piezoelectric layer,
wherein the substrate includes carbon and zirconium, and
amount of carbon contained in the substrate is 0.26 to less than 14.00 percent by atom, and a ratio (C/Zr) of a number of carbon atoms to a number of zirconium atoms each contained in the substrate is 0.1 to 0.5.

* * * * *